(12) United States Patent
Kerr et al.

(10) Patent No.: US 10,320,379 B2
(45) Date of Patent: Jun. 11, 2019

(54) TRANSISTOR-BASED RADIO FREQUENCY (RF) SWITCH

(71) Applicant: Qorvo US, Inc., Greensboro, NC (US)

(72) Inventors: Daniel Charles Kerr, Oak Ridge, NC (US); Jinsung Choi, Greensboro, NC (US); Baker Scott, San Jose, CA (US); George Maxim, Saratoga, CA (US); Hideya Oshima, Santa Clara, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/849,074

(22) Filed: Dec. 20, 2017

(65) Prior Publication Data

US 2018/0175851 A1 Jun. 21, 2018

Related U.S. Application Data

(60) Provisional application No. 62/437,420, filed on Dec. 21, 2016.

(51) Int. Cl.
*H03K 17/16* (2006.01)
*H04B 1/44* (2006.01)
*H03K 17/693* (2006.01)
*H03K 17/10* (2006.01)

(52) U.S. Cl.
CPC ......... *H03K 17/161* (2013.01); *H03K 17/102* (2013.01); *H03K 17/162* (2013.01); *H03K 17/693* (2013.01); *H04B 1/44* (2013.01); *H03K 2217/0018* (2013.01); *H03K 2217/0054* (2013.01)

(58) Field of Classification Search
CPC combination set(s) only.
See application file for complete search history.

(56) References Cited

U.S. PATENT DOCUMENTS

| | | | |
|---|---|---|---|
| 4,317,055 A | 2/1982 | Yoshida et al. | |
| 5,382,826 A | 1/1995 | Mojaradi et al. | |
| 6,803,680 B2 | 10/2004 | Brindle et al. | |
| 7,345,521 B2 * | 3/2008 | Takahashi | H04B 1/48 327/308 |

(Continued)

OTHER PUBLICATIONS

Non-Final Office Action for U.S. Appl. No. 15/401,903, dated Sep. 6, 2018, 14 pages.

(Continued)

*Primary Examiner* — An T Luu
(74) *Attorney, Agent, or Firm* — Winthrow & Terranova, P.L.L.C.

(57) ABSTRACT

Disclosed is a transistor-based switch having an N number of main field-effect transistors (FETs) stacked in series such that a first terminal of a first main FET of the N number of main FETs is coupled to a first end node and a second terminal of an Nth main FET of the N number of main FETs is coupled to a second end node, wherein N is a finite number greater than five. The transistor-based switch further includes a gate bias network having a plurality of gate resistors, wherein individual ones of the plurality of gate resistors are coupled to gate terminals of the N number of main FETs. A common gate resistor is coupled between a gate control input and a gate control node of the plurality of gate resistors, and a capacitor is coupled between the gate control node and a switch path node of the main FETs.

19 Claims, 9 Drawing Sheets

(56) References Cited

U.S. PATENT DOCUMENTS

| | | | |
|---|---|---|---|
| 7,459,988 B1* | 12/2008 | Iversen | H01P 1/15 327/430 |
| 8,373,490 B2 | 2/2013 | Burgener et al. | |
| 8,461,903 B1* | 6/2013 | Granger-Jones | H03K 17/04 327/427 |
| 8,723,260 B1 | 5/2014 | Carroll et al. | |
| 8,749,296 B2 | 6/2014 | Granger-Jones | |
| 8,779,859 B2 | 7/2014 | Su et al. | |
| 9,048,836 B2 | 6/2015 | Maxim et al. | |
| 9,143,124 B2* | 9/2015 | Cam | H01Q 1/50 |
| 9,190,994 B2 | 11/2015 | Hurwitz | |
| 9,214,932 B2 | 12/2015 | Clausen et al. | |
| 9,628,075 B2 | 4/2017 | Cebi et al. | |
| 9,667,244 B1 | 5/2017 | Cavus et al. | |
| 9,712,158 B1 | 7/2017 | Cavus et al. | |
| 9,843,293 B1 | 12/2017 | Wagh et al. | |
| 9,948,281 B2* | 4/2018 | Ranta | H03J 3/16 |
| 9,960,737 B1 | 5/2018 | Kovac | |
| 9,979,387 B2 | 5/2018 | Wu | |
| 2003/0181167 A1 | 9/2003 | Lida | |
| 2006/0194558 A1 | 8/2006 | Kelly | |
| 2008/0265978 A1 | 10/2008 | Englekirk | |
| 2011/0025404 A1 | 2/2011 | Cassia | |
| 2012/0049956 A1 | 3/2012 | Lam | |
| 2013/0278317 A1 | 10/2013 | Iversen et al. | |
| 2014/0009214 A1 | 1/2014 | Altunkilic et al. | |
| 2014/0253217 A1 | 9/2014 | Briere | |
| 2015/0270806 A1 | 9/2015 | Wagh et al. | |
| 2015/0381171 A1 | 12/2015 | Cebi et al. | |
| 2016/0322385 A1 | 11/2016 | Fuh et al. | |
| 2016/0329891 A1 | 11/2016 | Bakalski et al. | |
| 2017/0201244 A1 | 7/2017 | Kerr | |
| 2017/0201245 A1 | 7/2017 | Scott et al. | |
| 2017/0201248 A1 | 7/2017 | Scott et al. | |
| 2017/0272066 A1 | 9/2017 | Scott et al. | |
| 2018/0145678 A1 | 5/2018 | Maxim et al. | |
| 2018/0167062 A1 | 6/2018 | Shanjani et al. | |

OTHER PUBLICATIONS

Non-Final Office Action for U.S. Appl. No. 15/401,936, dated Sep. 12, 2018, 14 pages.

Kelly, D. et al., "The state-of-the-art of silicon-on-sapphire CMOS RF switches," IEEE 2005 Compound Semiconductor Integrated Circuit Symposium, Oct. 30-Nov. 2, 2005, pp. 200-203.

Shifrin, M.B. et al., "Monolithic FET structures for high-power control component applications," IEEE Transactions on Microwave Theory and Techniques, Dec. 1989, pp. 2134-2141, vol. 37, No. 12.

Tinella, C. et al, "0.13/spl mu/m CMOS SOI SP6T antenna switch for multi-standard handsets," 2006 Topical Meeting on Silicon Monolithic Integrated Circuits in RF Systems, Jan. 18-20, 2006, pp. 58-61.

Non-Final Office Action for U.S. Appl. No. 12/880,634, dated Aug. 10, 2012, 5 pages.

Final Office Action for U.S. Appl. No. 12/880,634, dated Nov. 26, 2012, 8 pages.

Notice of Allowance for U.S. Appl. No. 13/892,992, dated Feb. 7, 2014, 7 pages.

Non-Final Office Action for U.S. Appl. No. 13/892,992, dated Oct. 10, 2013, 5 pages.

Notice of Allowance for U.S. Appl. No. 15/294,337, dated Jul. 7, 2018, 10 pages.

Non-Final Office Action for U.S. Appl. No. 15/585,345, dated Feb. 23, 2018, 5 pages.

Lu, Jian et al., "Modeling, Design, and Characterization of Multiturn Bondwire Inductors With Ferrite Epoxy Glob Cores for Power Supply System-on-Chip or System-in-Package Applications," IEEE Transactions on Power Electronics, vol. 25, Issue 8, Aug. 2010, pp. 2010-2017.

Final Office Action for U.S. Appl. No. 15/401,903, dated Jan. 15, 2019, 14 pages.

Non-Final Office Action for U.S. Appl. No. 15/401,903, dated Feb. 26, 2019, 14 pages.

Final Office Action for U.S. Appl. No. 15/401,936, dated Feb. 26, 2019, 14 pages.

* cited by examiner ize, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. Like-

TRANSISTOR-BASED RADIO FREQUENCY (RF) SWITCH

RELATED APPLICATIONS

This application claims the benefit of provisional patent application Ser. No. 62/437,420, filed Dec. 21, 2016, the disclosure of which is hereby incorporated herein by reference in its entirety.

FIELD OF THE DISCLOSURE

Embodiments of the present disclosure relate to silicon-on-insulator technology and semiconductor-based radio frequency switches, both of which can be used in radio frequency communications circuits.

BACKGROUND

As technology progresses, wireless communications devices, such as smart phones, wireless capable computers, and the like, are becoming increasingly integrated, feature rich, and complex. Such wireless communications devices rely on semiconductor technologies, such as silicon-based technologies, which are evolving toward smaller circuit geometries, lower power consumption, higher operating speeds, and increased complexity. Complementary metal oxide semiconductor technology is an example of a silicon-based technology. Further, wireless communications devices may need to support multiple communications bands, multiple communications modes, multiple communications protocols, and the like. As such, wireless communications devices rely upon transistor-based radio frequency (RF) switches to select between different RF circuits depending on which communications bands, modes, and protocols are in use. Such complex RF systems may place strict linearity, insertion loss, and isolation demands on the transistor-based RF switches.

In general, transistor-based RF switches used to switch RF power within communications circuitry have a stringent linearity requirement. The already stringent linearity requirement is increasing due to downlink and uplink carrier aggregation. In some instances, the noise contributed by the circuit nonlinearities should be less than −115 dBm. Thus, there is a need for transistor-based RF switches having improved linearity performance to meet increased transistor-based RF switch linearity requirements.

SUMMARY

Disclosed is a transistor-based radio frequency switch having an N number of main field-effect transistors (FETs) stacked in series such that a first terminal of a first main FET of the N number of main FETs is coupled to a first end node and a second terminal of an Nth main FET of the N number of main FETs is coupled to a second end node, wherein N is a finite number greater than five. The transistor-based radio frequency switch further includes a gate bias network having a plurality of gate resistors, wherein individual ones of the plurality of gate resistors are coupled to gate terminals of the N number of FETs. A common gate resistor is coupled between a gate control input and a gate control node of the plurality of gate resistors, and a capacitor is coupled between the gate control node and a switch path node of the main FETs.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
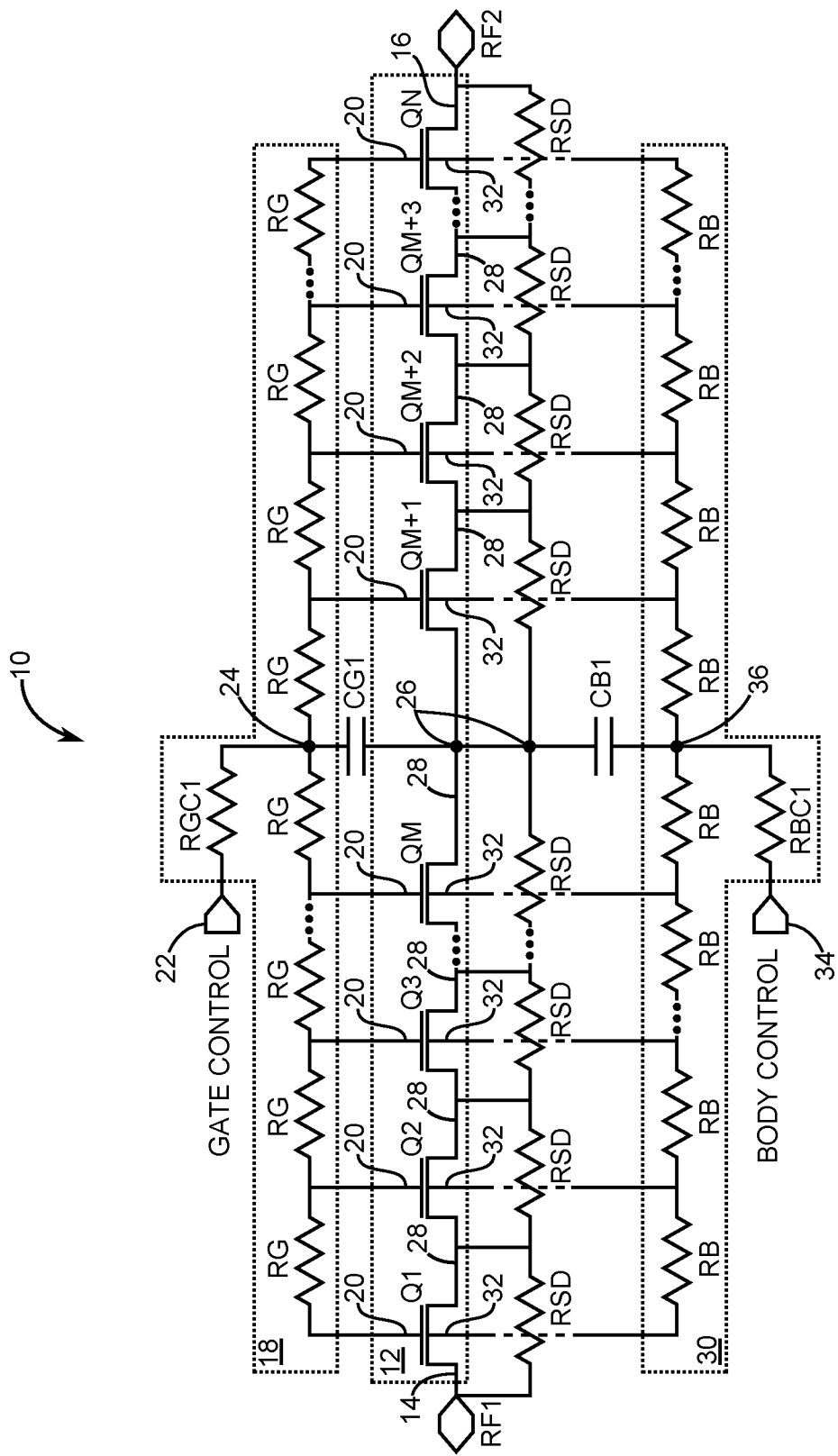
FIG. 1 is a schematic diagram of a first embodiment of a transistor-based radio frequency (RF) switch that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic diagram of a first embodiment of a transistor-based radio frequency (RF) switch 10 that is structured in accordance with the present disclosure. The transistor-based RF switch 10 has an N number of main field-effect transistors (FETs) 12 that are stacked in series such that a first terminal 14 of a first main FET Q1 is coupled to a first end node RF1 and a second terminal 16 of an Nth main FET QN is coupled to a second end node RF2, wherein N is a finite number greater than five. In at least some embodiments, the N number of main FETs 12 are of the silicon-on-insulator type. The transistor-based RF switch 10 further includes a gate bias network 18 having a plurality of gate resistors RG. In general, individual ones of the plurality of gate resistors RG are coupled to gate terminals 20 of the N number of main FETs 12. In particular, in the exemplary embodiment of FIG. 1, one of the plurality of gate resistors RG is coupled between gate terminals 20 of adjacent ones of the N number of main FETs 12. The gate bias network 18 further includes a common gate resistor RGC1 that is coupled between a gate control input 22 and a gate control node 24 of the plurality of gate resistors RG. In exemplary embodiments of the transistor-based RF switch 10, the gate control node 24 is located between a first group of the plurality of gate resistors RG to the left and a second group of the plurality of gate resistors RG to the right, wherein the number of gate resistors RG in the first group is equal to the number of gate resistors RG in the second group.

A first gate capacitor CG1 is coupled between the gate control node 24 and a switch path node 26 of the N number of main FETs 12. In exemplary embodiments, the switch path node 26 is located between a first group Q1 through QM of the N number of main FETs 12 and a second group QM+1 through QN of the N number of main FETs 12, wherein the first group of the N number of main FETs 12 is equal in number to the second group of the N number of main FETs 12. In the exemplary embodiment of FIG. 1, the first group is made up of four main FETS Q1, Q2, Q3, and QM, and the second group is made up of four main FETs QM+1, QM+2, QM+3, and QN, wherein M is set to 4 and N is set to 8. However, it is to be understood that N can be any counting number greater than 5. For example, if N is set to 32, then the first group and the second group each have 16 FETs apiece.

The transistor-based RF switch 10 further includes a plurality of source-to-drain resistors RSD that are coupled between source/drain terminals 28. The transistor-based RF switch 10 still further includes a body bias network 30 having a plurality of body resistors RB, wherein one of the plurality of body resistors RB is coupled between body terminals 32 of adjacent ones of the N number of main FETs 12. The body bias network 30 further includes a common body resistor RBC1 that is coupled between a body control input 34 and a body control node 36 of the plurality of body resistors RG. A first body capacitor CB1 is coupled between the body control node 36 and the switch path node 26 of the N number of main FETs 12. In some embodiments a capacitance value of the gate capacitor CG1 and the body capacitor CB1 is between 0.1 picofarad and 10 picofarads. In some embodiments, the capacitance value of the gate capacitor CG1 and the body capacitor CB1 is between 0.1 picofarad and 1 picofarad. In yet other embodiments, the capacitance value of the gate capacitor CG1 and the body capacitor CB1 is between 1 picofarad and 10 picofarads. In some embodiments, both of the gate capacitor CG1 and the body capacitor CB1 capacitor are metal-insulator-metal type capacitors. Moreover, in some embodiments, a resistance value of the common gate resistor RGC1 and the common body resistor RBC1 is between 2 kΩ and 100 kΩ. In some embodiments, the resistance value of the common gate resistor RGC1 and the common body resistor RBC1 is between 2 kΩ and 10 kΩ. In other embodiments the resistance value of the common gate resistor RGC1 and the common body resistor RBC1 is between 10 kΩ and 100 kΩ. In at least some embodiments, the resistance of each of the plurality of gate resistors RG is equal to the resistance of the common gate resistor RGC1 within ±10%.

In operation, bias voltages are applied to the gate control input 22 and the body control input 34, causing the first gate capacitor CG1 and the first body capacitor CB1 to charge and thereby balance the gate bias voltage and body bias voltage applied to each of the N number of main FETs 12. Harmonics generated by the transistor-based RF switch 10 are reduced as a result of the balanced gate bias voltage and balanced body bias voltage applied to each of the N number of main FETs 12. In at least some embodiments, second harmonics are reduced by greater than 30 dB compared with the structure of the transistor-based RF switch 10 without the first gate capacitor CG1 and the first body capacitor CB1.

Figure 2:
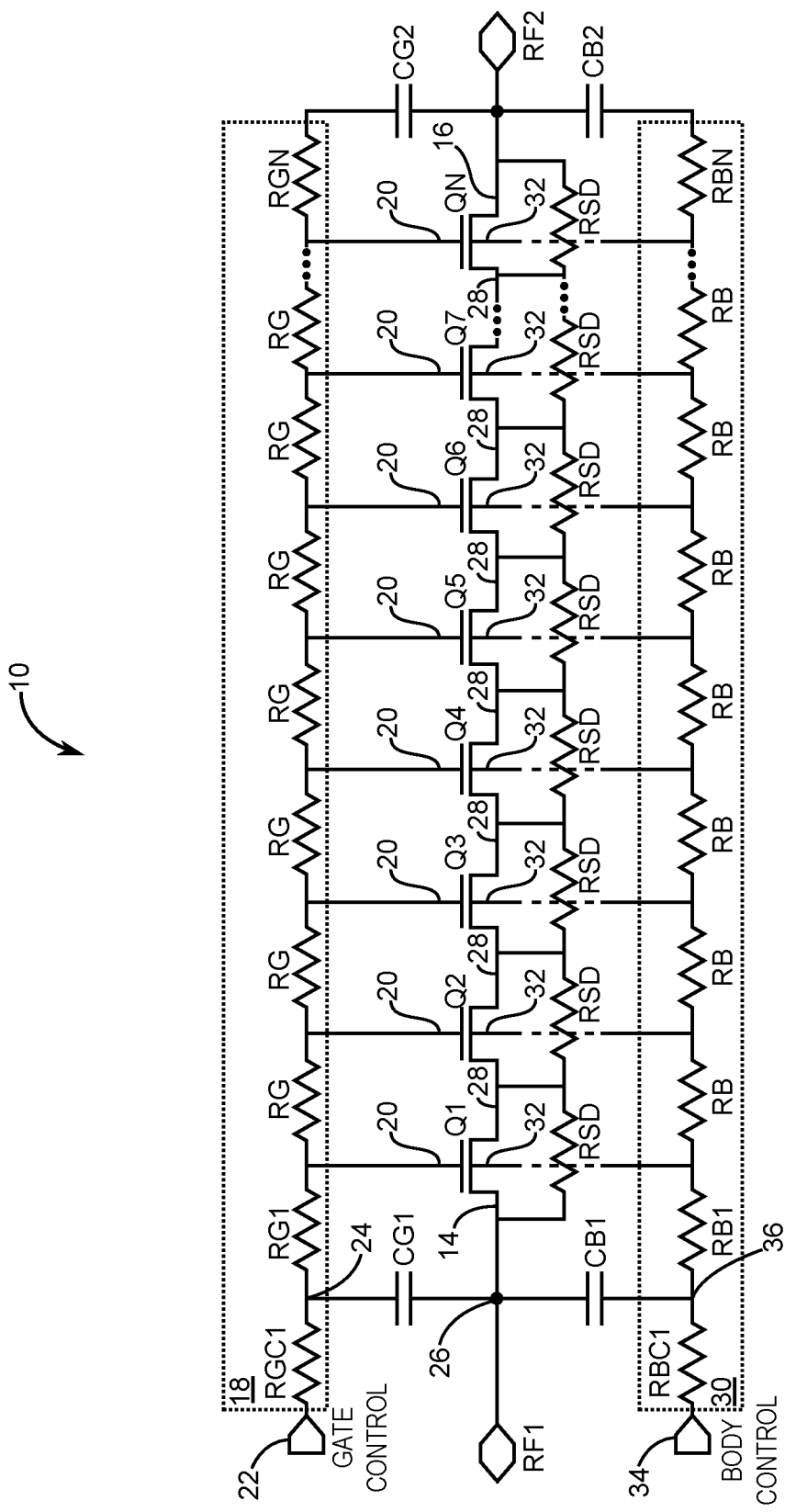
FIG. 2 is a schematic diagram of a second embodiment of the transistor-based RF switch that is structured in accordance with the present disclosure.

FIG. 2 is a schematic diagram of an exemplary second embodiment of the transistor-based RF switch 10 that is structured in accordance with the present disclosure. In this exemplary second embodiment, the switch path node 26 is located such that the first terminal 14 of the first main FET Q1 is coupled directly to the switch path node 26. Moreover, in this exemplary second embodiment, the gate control node 24 is located between the common gate resistor RGC1 and a first gate resistor RG1 of the plurality of gate resistors RG and is coupled to one of the gate terminals 20 associated with the first main FET Q1. The first gate capacitor CG1 is coupled between the gate control node 24 and the switch path node 26. Further still, in this exemplary second embodiment, the body control node 36 is located between the common body resistor RBC1 and a first body resistor RB1 of the plurality of body resistors RB and is coupled to one of the body terminals 32 associated with the first main FET Q1. The first body capacitor CB1 is coupled between the body control node 36 and the switch path node 26.

A second gate capacitor CG2 is coupled between the second terminal 16 of the Nth main FET QN and one of the gate terminals 20 associated with the Nth main FET QN through a last gate resistor RGN of the plurality of gate resistors RG nearest to the second end node RF2. A second body capacitor CB2 is coupled between the second terminal 16 of the Nth main FET QN and one of the body terminals 32 associated with the Nth main FET QN through a last body resistor RBN of the plurality of body resistors RB nearest to the second end node RF2.

Figure 3:
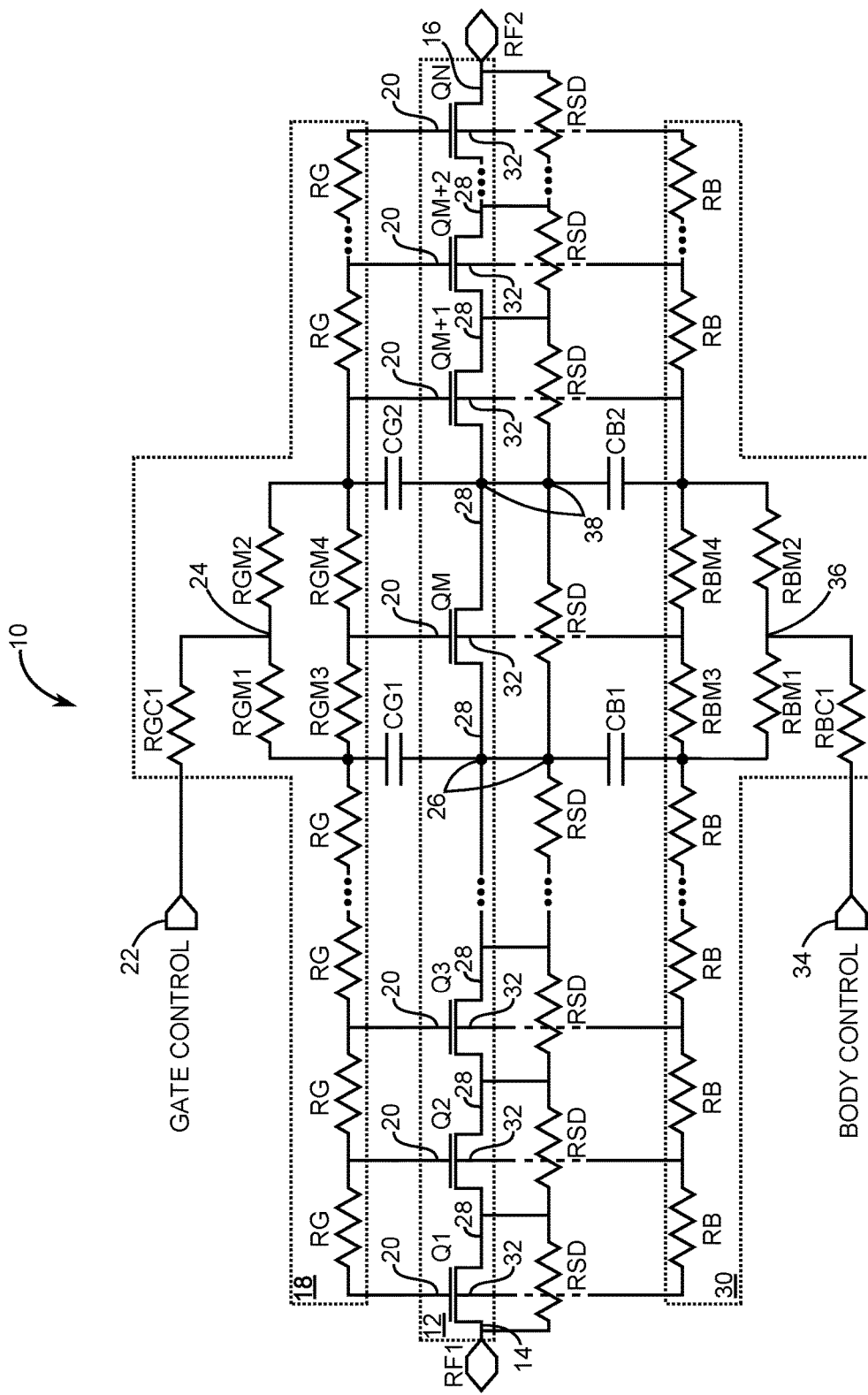
FIG. 3 is a schematic diagram of a third embodiment of the transistor-based RF switch that is structured in accordance with the present disclosure.

FIG. 3 is a schematic diagram of a third embodiment of a transistor-based RF switch 10 that is structured in accordance with the present disclosure. In this third exemplary embodiment, the first gate capacitor CG1 is coupled to the gate control node 24 through a first middle gate resistor RGM1. Moreover, the second gate capacitor CG2 is coupled between the gate control node 24 and a second switch path node 38 through a second middle gate resistor RGM2. Also, in this exemplary third embodiment, N is an odd number and the middle FET QM of the N number of main FETs 12 is coupled directly between the switch path node 26 and the second switch path node 38. The resistance values of the first middle gate resistor RGM1 and the second middle gate resistor RGM2 are typically within ±10% of the same resistance value of the other ones of the plurality of gate resistors RG. However, a third middle gate resistor RGM3 and a fourth middle gate resistor RGM4 that are coupled directly to the gate terminal 20 of the middle FET QM typically have twice the resistance value ±10% of the other ones of the plurality of gate resistors RG.

Further still, in this third exemplary embodiment, the first body capacitor CB1 is coupled to the body control node 36 through a first middle body resistor RBM1. Moreover, the second body capacitor CB2 is coupled between the body control node 36 and the second switch path node 38 through a second middle body resistor RBM2. The resistance values of the first middle body resistor RBM1 and the second middle body resistor RBM2 are typically within ±10% the same resistance value of the other ones of the plurality of body resistors RB. However, a third middle body resistor RBM3 and a fourth middle body resistor RBM4 that are coupled directly to the body terminal 32 of the middle FET QM typically have twice the resistance value ±10% of the other ones of the plurality of body resistors RB.

Figure 4:
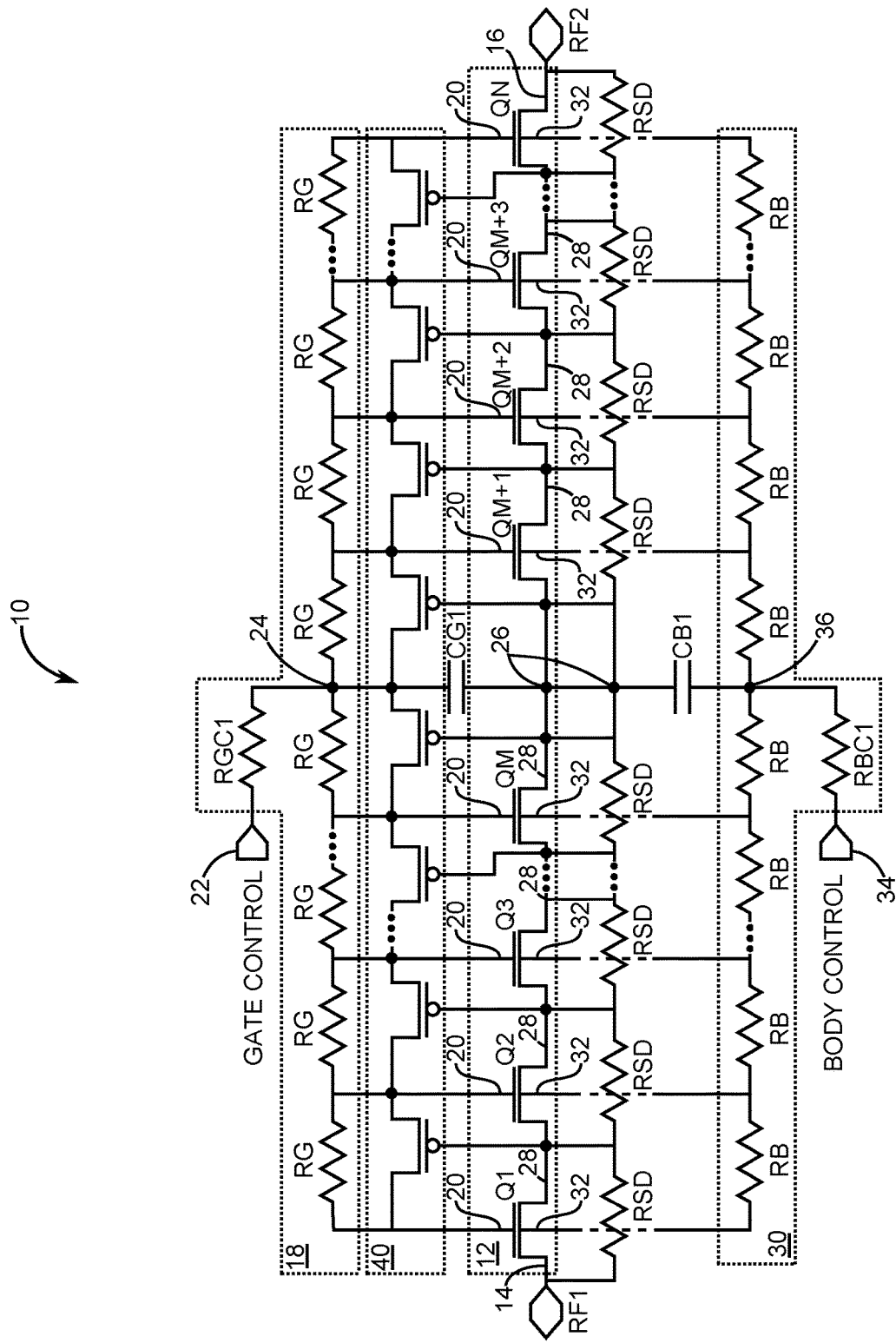
FIG. 4 is a schematic of a fourth embodiment of the transistor-based RF switch that is structured in accordance with the present disclosure.

FIG. 4 is a schematic of a fourth embodiment of the transistor-based RF switch 10 that is structured in accordance with the present disclosure. This exemplary fourth embodiment has a structure that is identical to the structure of the first embodiment of FIG. 1 with an exception of an addition of a plurality of speed-up FETs 40. Individual ones of the plurality of speedup FETs 40 are coupled across corresponding ones of the plurality of gate resistors RG such that the plurality of gate resistors RG are shorted when the plurality of speedup FETs 40 are in an ON state.

Figure 5:
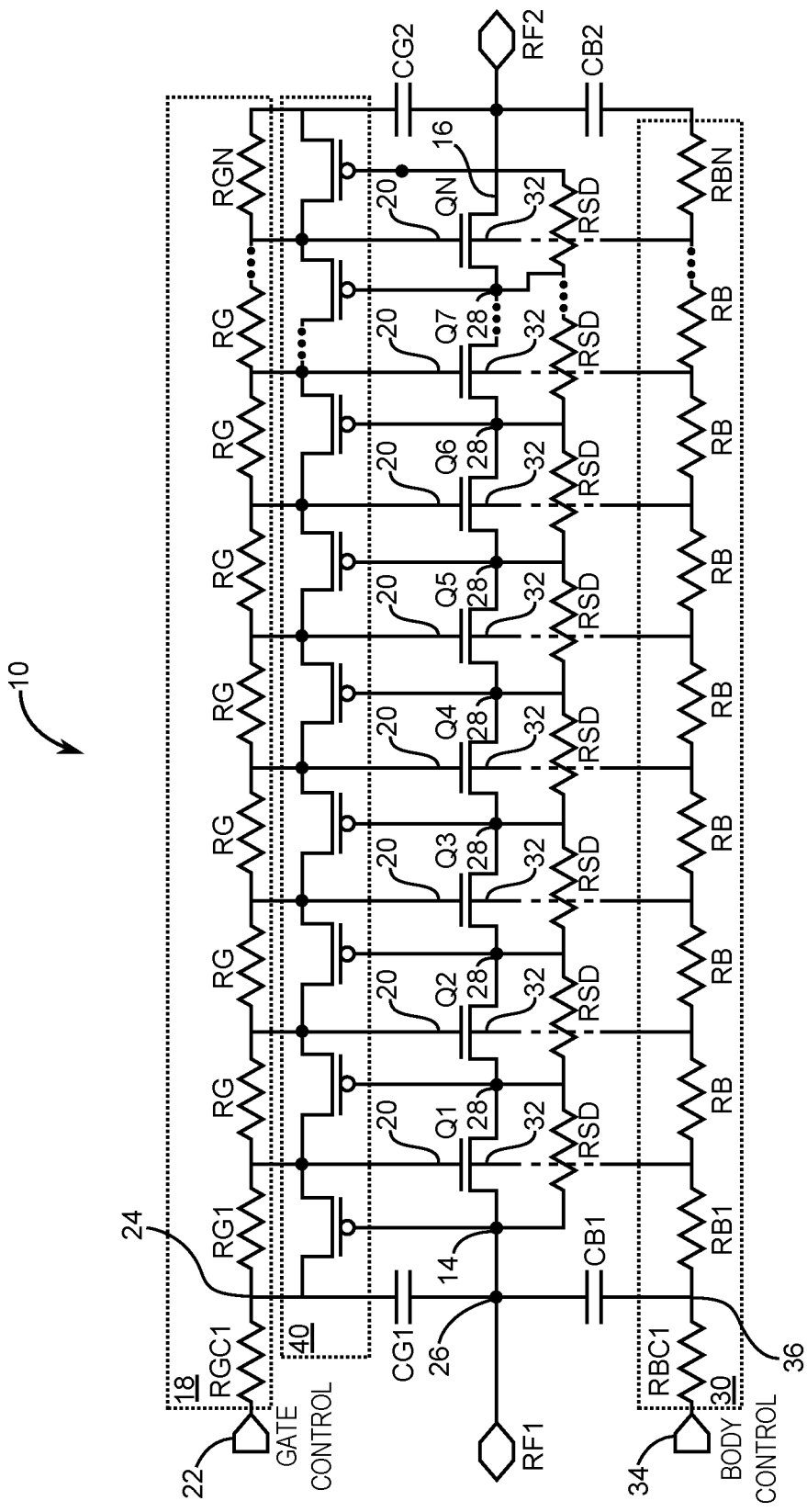
FIG. 5 is a schematic of a fifth embodiment of the transistor-based RF switch that is structured in accordance with the present disclosure.

FIG. 5 is a schematic of a fifth embodiment of the transistor-based RF switch 10 that is structured in accordance with the present disclosure. This exemplary fourth embodiment has a structure that is identical to the structure of the second embodiment of FIG. 2 with an exception of an addition of the plurality of speed-up FETs 40. As with the fourth embodiment of FIG. 4, individual ones of the plurality of speedup FETs 40 are coupled across corresponding ones of the plurality of gate resistors RG such that the plurality of gate resistors RG are shorted when the plurality of speedup FETs 40 are in an ON state.

Figure 6:
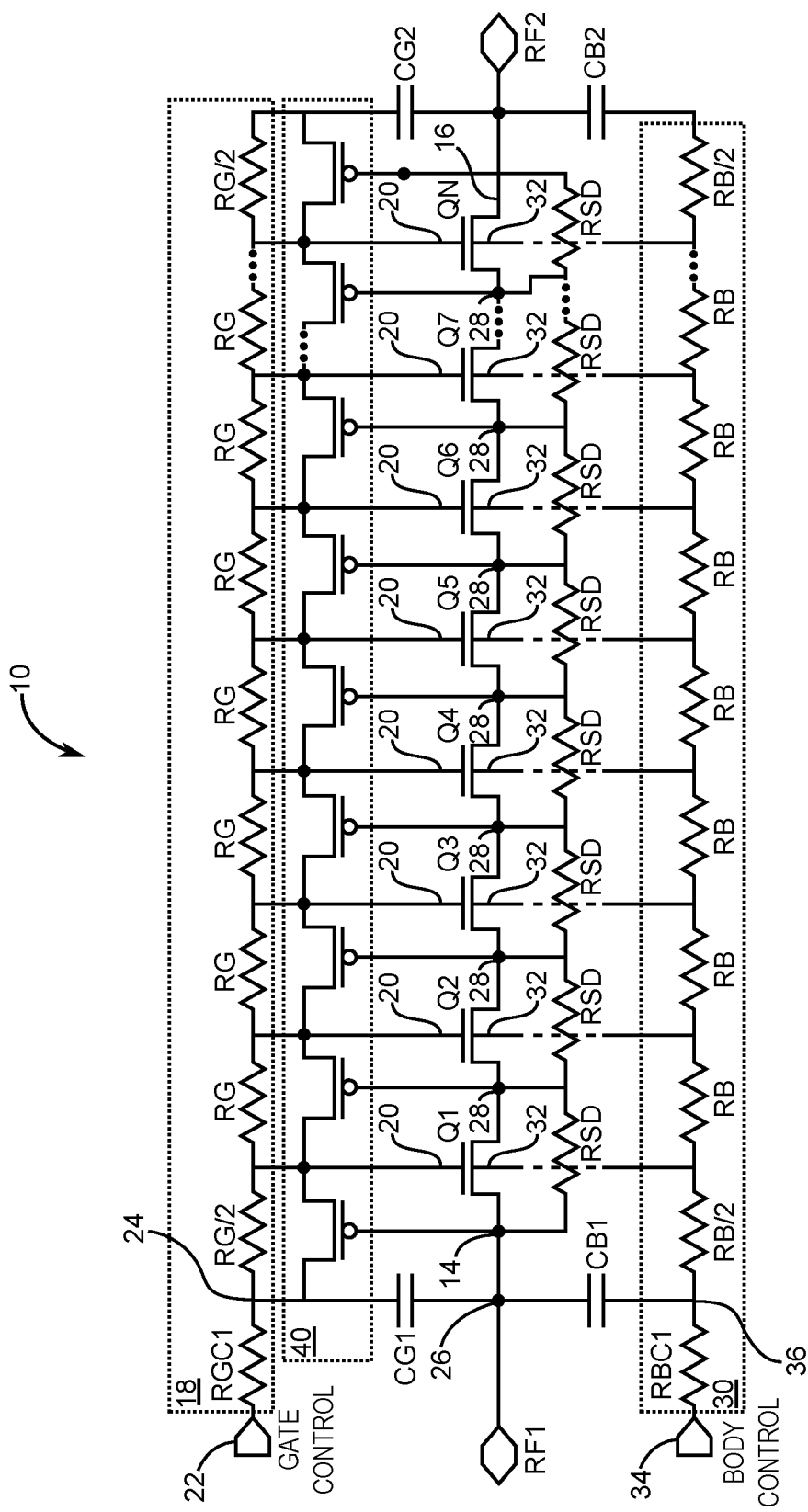
FIG. 6 is a schematic of a sixth embodiment of the transistor-based RF switch that is structured in accordance with the present disclosure.

FIG. 6 is a schematic of a sixth embodiment of the transistor-based RF switch 10 that is structured in accordance with the present disclosure. Performance of the sixth embodiment is enhanced in some applications over the fifth embodiment of FIG. 5 by fixing the resistance values of a nearest one of the plurality of gate resistors RG to the first end node RF1 and a nearest one of the plurality of gate resistors RG to the second end node RF2 to half the resistance value ±10% of individual ones of the remaining plurality of gate resistors RG. Performance of this sixth embodiment is further enhanced over the fifth embodiment in the same applications by fixing the resistance values of a nearest one of the plurality of body resistors RB to the first end node RF1 and a nearest one of the plurality of body resistors RB to the second end node RF2 to half the resistance value ±10% of individual ones of the remaining plurality of body resistors RB. For example, the fifth embodiment of FIG. 5 can be realized as the sixth embodiment by fixing the resistance values of the first gate resistor RG1 (FIG. 5), the last gate resistor RGN (FIG. 5), the first body resistor RB1 (FIG. 5), and the last body resistor RBN (FIG. 5) to within ±10% of half the resistance of individual ones of the remaining gate resistors RG and body resistors RB, respectively.

Figure 7:
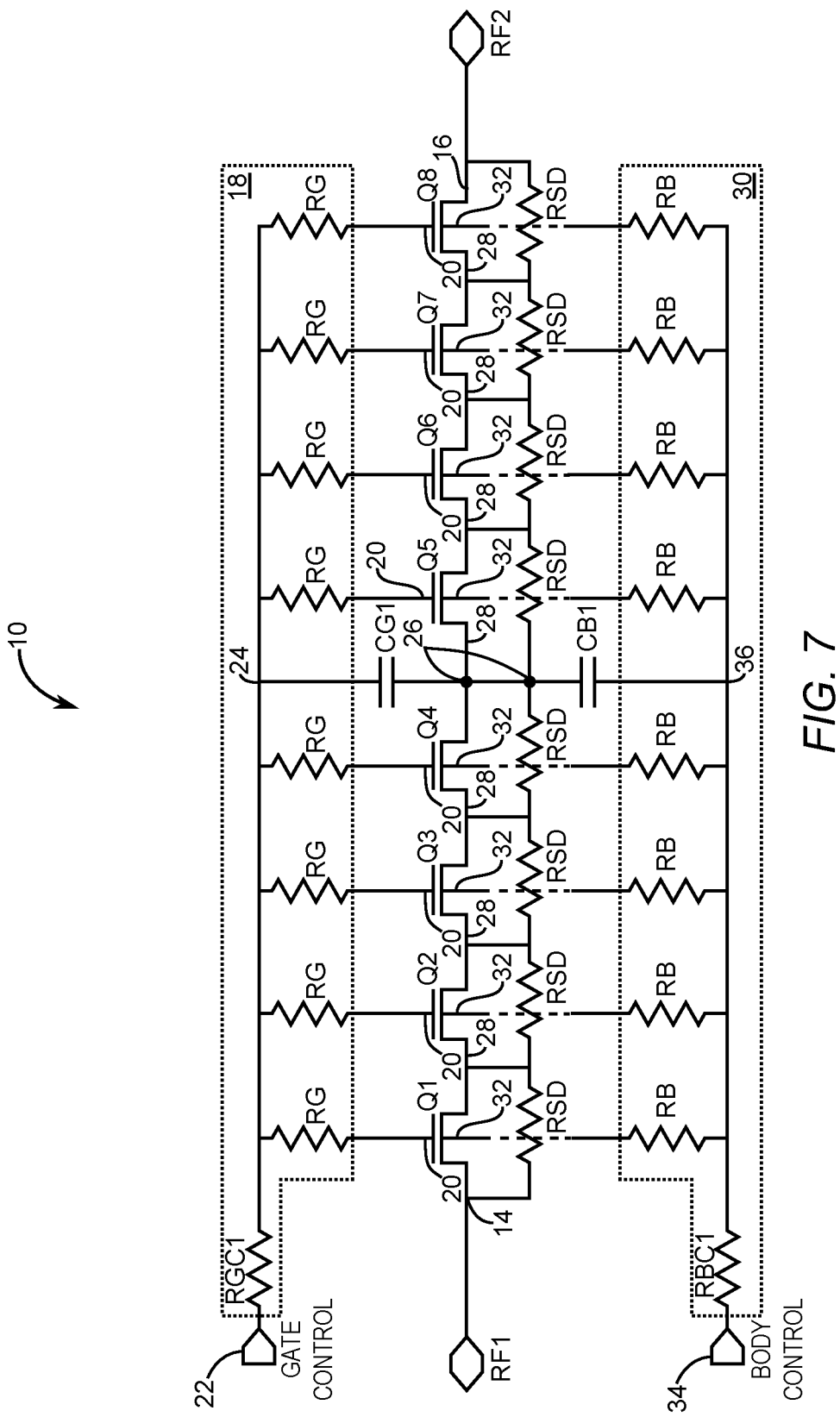
FIG. 7 is a schematic of a seventh embodiment of the transistor-based RF switch that is structured in accordance with the present disclosure.

FIG. 7 is a schematic of a seventh embodiment of the transistor-based RF switch 10 that is structured in accordance with the present disclosure. In this exemplary seventh embodiment, the gate bias network 18 is a parallel bias network, wherein individual ones of the plurality of gate resistors RG are coupled between the gate control node 24 and the gate terminals 20 of the N number of main FETs 12. Also, the switch path node 26 is located between a first group of the N number of main FETs 12 and a second group of the N number of main FETS 12 such that the first group and the second group have an equal number of FETs. In the exemplary embodiment, the first group is made up of FETs Q1-Q4 and the second group is made up of FETs Q5-Q8. In this exemplary embodiment, the first gate capacitor CG1 is coupled between the gate control node 24 and the switch path node 26. Further still, in this exemplary seventh embodiment, the body bias network 30 is a parallel bias network, wherein individual ones of the plurality of body resistors RB are coupled between the body control node 36 and the body terminals 32 of the N number of main FETs 12. Also, the first body capacitor CB1 is coupled between the body control node 36 and the switch path node 26.

Figure 8:
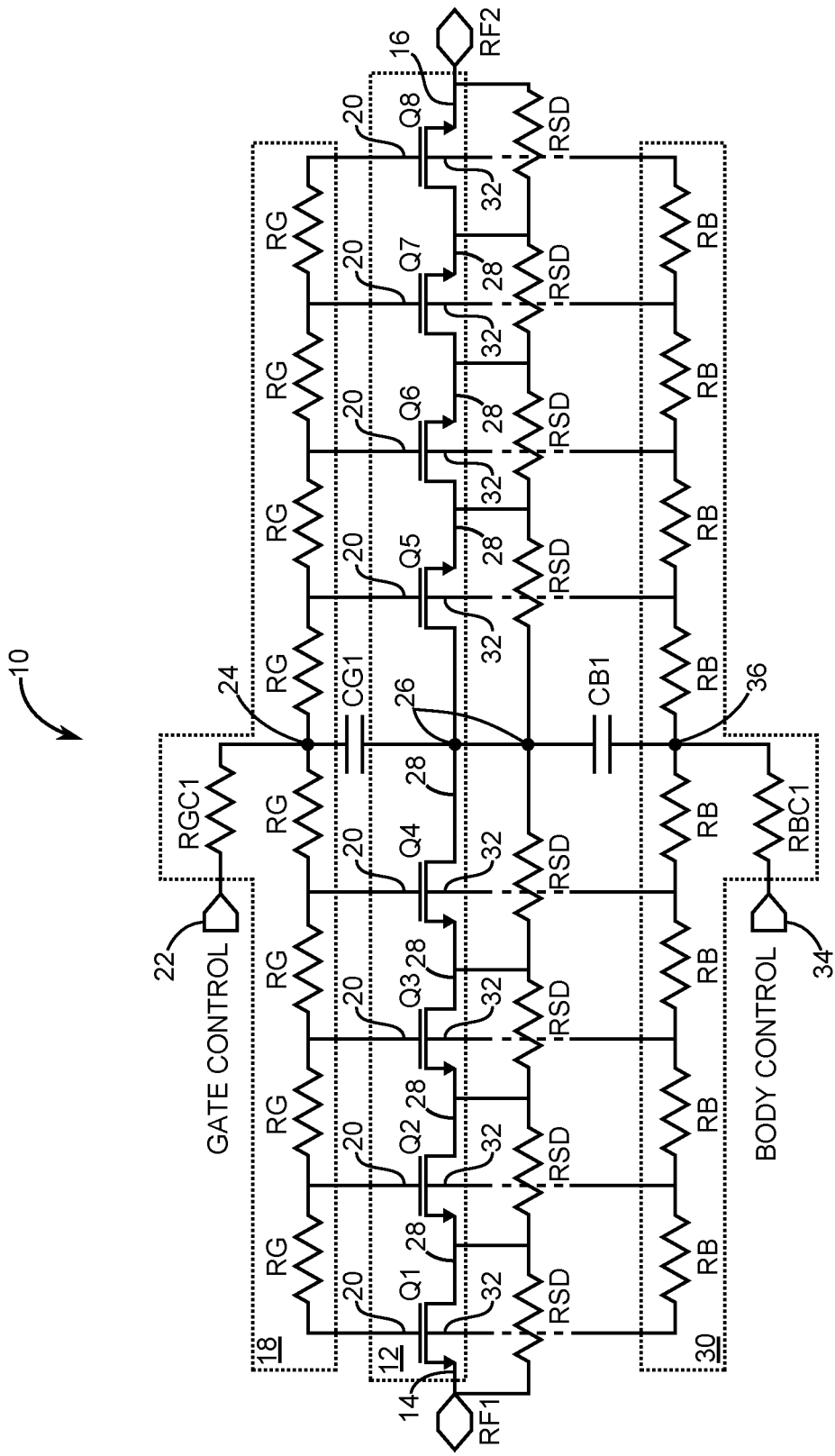
FIG. 8 is a schematic of an eighth embodiment of the transistor-based RF switch that is structured in accordance with the present disclosure.

FIG. 8 is a schematic of an eighth embodiment of the transistor-based RF switch 10 that is structured in accordance with the present disclosure. In this exemplary eighth embodiment, a first group Q1-Q4 of the N number of main FETs 12 has source terminals that are closer to the first end node RF1 and drain terminals that are closer to the second end node RF2, and a second group Q5-Q8 of the N number of main FETs 12 has drain terminals that are closer to the first end node RF1 and source terminals that are closer to the second end node RF2, wherein the number of main FETs in the first group is equal to the number of FETs in the second group. It is to be understood that while the eighth embodiment of FIG. 8 is depicted with N equal to 8 of the N number of main FETs 12, Q1-Q8, a larger number of main FETs may be included without deviating from the scope of the present disclosure.

Figure 9:
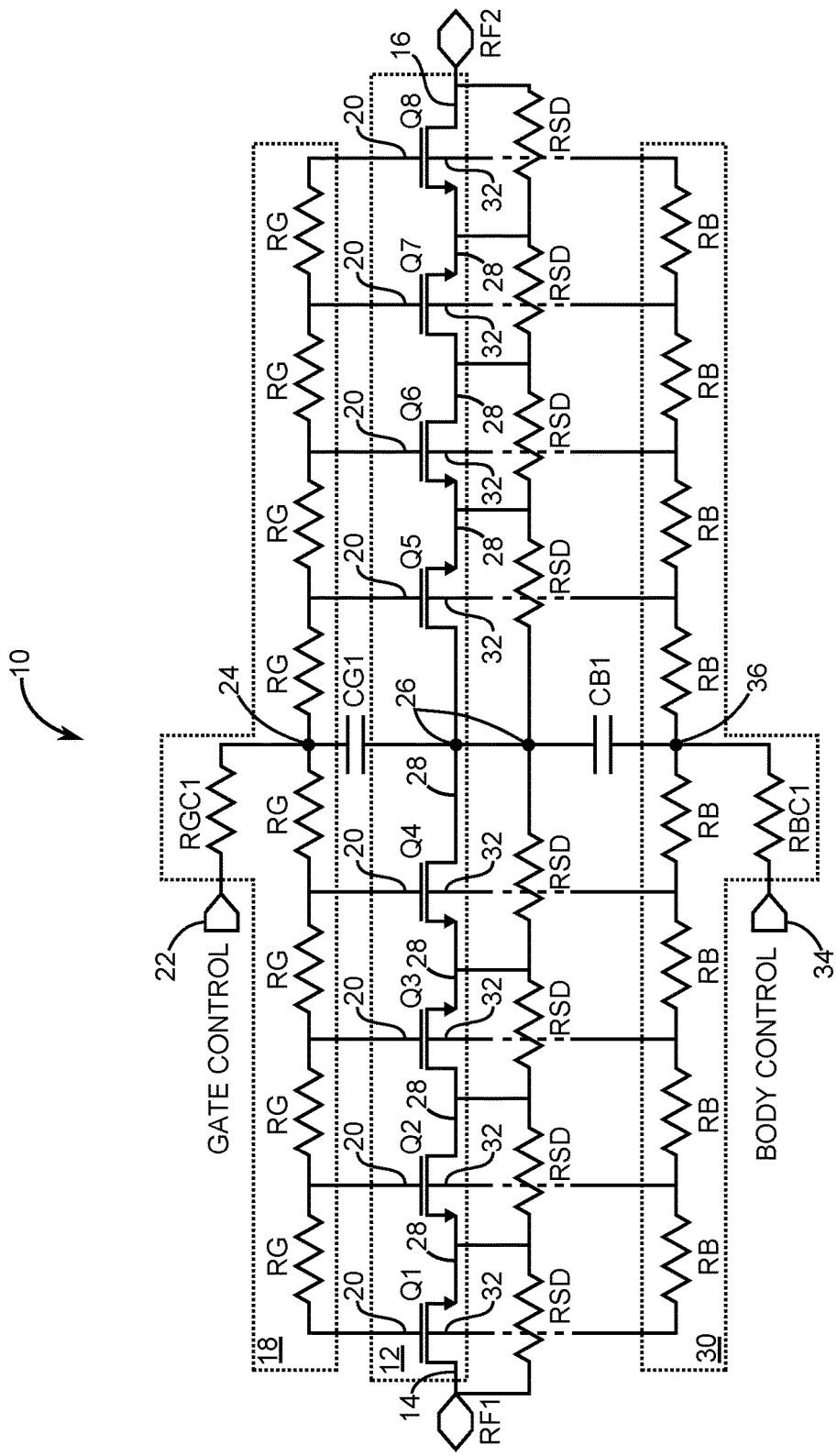
FIG. 9 is a schematic of a ninth embodiment of the transistor-based RF switch of the present disclosure.

FIG. 9 is a schematic of a ninth embodiment of the transistor-based RF switch 10 of the present disclosure. In this exemplary embodiment, a first group Q2, Q4, Q6, and Q8 of the N number of main FETs 12 has source terminals that are closer to the first end node RF1 and drain terminals that are closer to the second end node RF2, and a second group Q1, Q3, Q5, and Q7 of the N number of main FETs 12 has drain terminals that are closer to the first end node RF1 and source terminals that are closer to the second end node RF2, wherein the number of main FETs in the first group is equal to the number of FETs in the second group. It is to be understood that while the ninth embodiment of FIG. 9 is depicted with N equal to 8 of the N number of main FETs 12, Q1-Q8, a larger number of main FETs may be included without deviating from the scope of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A transistor-based radio frequency (RF) switch comprising:
    an N number of main field-effect transistors (FETs) stacked in series such that a first terminal of a first main FET of the N number of main FETs is coupled to a first end node and a second terminal of an Nth main FET of the N number of main FETs is coupled to a second end node, wherein N is a finite number greater than five;
    a gate bias network comprising:
        a plurality of gate resistors, wherein individual ones of the plurality of gate resistors are coupled between gate terminals of adjacent ones of the N number of main FETs;
        a common gate resistor coupled between a gate control input and a gate control node of the plurality of gate resistors; and
    a first capacitor coupled between the gate control node and a switch path node of the N number of main FETs.

2. The transistor-based RF switch of claim 1 further including a plurality of speed-up FETs, wherein individual ones of the plurality of speedup FETs are coupled across corresponding ones of the plurality of gate resistors such that the plurality of gate resistors are shorted when the plurality of speedup FETs are in an ON state.

3. The transistor-based RF switch of claim 2 wherein the N number of main FETs are N-type and the plurality of speed-up FETs are P-type.

4. The transistor-based RF switch of claim 1 wherein the switch path node is located between a first group of the N number of main FETs coupled between the first end node and the switch path node and a second group of the N number of main FETs coupled between the switch path node and the second end node.

5. The transistor-based RF switch of claim 4 wherein the first group and the second group are made up of an equal number of the N number of main FETs.

6. The transistor-based RF switch of claim 5 wherein both a nearest one of the plurality of gate resistors to the first end node and a nearest one of the plurality of gate resistors to the second end node have within ±10% of half of a resistance value of each remaining one of the plurality of gate resistors.

7. The transistor-based RF switch of claim 1 wherein the switch path node is coupled to the first terminal of the first main FET.

8. The transistor-based RF switch of claim 7 further including a second capacitor coupled between the second terminal of the Nth main FET and one of the gate terminals associated with the Nth main FET through one of the plurality of gate resistors nearest to the second end node.

9. The transistor-based RF switch of claim 1 further including a second capacitor coupled between the gate control node and a second switch path node, wherein N is an odd number and the middle one of the N number of main FETs is coupled directly between the switch path node and the second switch path node.

10. The transistor-based RF switch of claim 1 wherein a first group of the N number of main FETs has source terminals that are closer to the first end node and drain terminals that are closer to the second end node and a second group of the N number of main FETs has drain terminals that are closer to the first end node and source terminals that are closer to the second end node, wherein the first group is equal in number to the second group.

11. The transistor-based RF switch of claim 10 wherein the first group comprises half of the N number of main FETs, wherein N is an even number.

12. The transistor-based RF switch of claim 10 wherein each of the first group of the N number of main FETs is coupled to an adjacent one of the second group of the N number of main FETs.

13. The transistor-based RF switch of claim 1 wherein the first capacitor is a metal-insulator-metal type capacitor.

14. The transistor-based RF switch of claim 1 wherein capacitance of the first capacitor is between 0.1 picofarad and 10 picofarads.

15. The transistor-based RF switch of claim 1 where resistance of the common gate resistor is between 2 kΩ and 100 kΩ.

16. The transistor-based RF switch of claim 15 wherein the resistance of each one of the plurality of gate resistors is equal to the resistance of the common gate resistor within ±10%.

17. The transistor-based RF switch of claim 1 further comprising:
    a body bias network having a plurality of body resistors, wherein individual ones of the plurality of body resistors are coupled to body terminals of the N number of main FETs, and a common body resistor is coupled between a body control input and a body control node of the plurality of body resistors; and
    a second capacitor coupled between the body control node and the switch path node of the N number of main FETs.

18. The transistor-based RF switch of claim 1 further including a plurality of source-to-drain resistors wherein individual ones of the plurality of source-to-drain resistors are coupled between drain terminals and source terminals of individual ones of the N number of main FETs.

19. The transistor-based RF switch of claim 1 wherein the N number of main FETs are of the silicon-on-insulator type.

* * * * *